US006275076B1

(12) United States Patent
Simony

(10) Patent No.: US 6,275,076 B1
(45) Date of Patent: Aug. 14, 2001

(54) SAMPLE-AND-HOLD DEVICE USING COMPLEMENTARY BIPOLAR TECHNOLOGY

(75) Inventor: Laurent Simony, Grenoble (FR)

(73) Assignee: Thomson-CSF, Paris (FR)

(*) Notice: Subject to any disclaimer, the term of this patent is extended or adjusted under 35 U.S.C. 154(b) by 0 days.

(21) Appl. No.: 09/526,200

(22) Filed: Mar. 15, 2000

(30) Foreign Application Priority Data

Mar. 16, 1999 (FR) .................................................. 99 03233

(51) Int. Cl.$^7$ ................................................ G11C 27/02
(52) U.S. Cl. .............................................................. 327/94
(58) Field of Search .................................. 327/91, 93, 94, 327/96, 478, 483, 484, 490, 491; 341/122

(56) References Cited

U.S. PATENT DOCUMENTS

| 4,806,790 | | 2/1989 | Sone ........................................ 327/94 |
| 5,039,880 | * | 8/1991 | Astegher et al. ........................ 327/96 |
| 5,510,736 | * | 4/1996 | Van de Plassche ..................... 327/91 |
| 5,691,657 | * | 11/1997 | Hirano et al. ............................ 327/94 |
| 6,034,556 | * | 3/2000 | Koyasu et al. .......................... 327/96 |

FOREIGN PATENT DOCUMENTS 0851 434 A2   7/1998  (EP) .

* cited by examiner

Primary Examiner—My-Trang Nu Ton
(74) Attorney, Agent, or Firm—Oblon, Spivak, McClelland, Maier & Neustadt, P.C.

(57) ABSTRACT

The proposed sample-and-hold device using a complementary bipolar technology comprises a follower input stage having an input receiving a voltage Vin to be sampled, at least one sampling circuit having a switching stage to be placed either in a first state called a "follower" state where its output follows the potential at its signal input or in a second state called an "isolated" state where its output is isolated from it signal input, the output of the switching stage being connected to the base of a first follower transistor whose emitter is connected to a terminal of an output sampling capacitor, the sampling circuit furthermore comprising a second transistor, having its emitter supplied by a current source and having its base connected to a potential copying that of the terminal of the output sampling capacitor, and a third transistor controlled by the digital command so as to be crossed by a current when the switching stage is in the <<isolated state>>, and so as to be off when the switching stage is in the <<follower>> state, the third transistor having its emitter connected to the base of the first transistor and its base connected to the emitter of the second transistor. Application to analog-digital converters, analog signal processing systems.

11 Claims, 3 Drawing Sheets

SAMPLE-AND-HOLD DEVICE USING COMPLEMENTARY BIPOLAR TECHNOLOGY

BACKGROUND OF THE INVENTION

The invention relates to sample-and-hold devices using complementary bipolar technology.

Sample-and-hold devices are used in many fields of electronics and especially in analog-digital converters and in analog signal processing systems.

The main function of a sample-and-hold device is to copy, starting from a given point in time t0 and for a very short period of time $\Delta t$, the level of a voltage Vin applied to an input of the sample-and-hold devices and to store it for a time that is long enough to perform a specified processing of this level at t0. The period of time $\Delta t$ is understood to be very short as compared with the relative variations of the input voltage Vin.

The sample-and-hold device may take two different states corresponding to two different modes of operation.

In a first state, the sample-and-hold device is in "follower" mode and an output of the sample-and-hold device reproduces a faithful image of the input voltage Vin applied to its input.

In the second state, the sample-and-hold device is in the "held" mode and its output is isolated from its input.

A certain number of criteria of quality of the sample-and-hold device have been defined, certain criteria being related to one mode of operation or to the other.

For example, these criteria of quality include the following in follower mode:

the maximum level (full scale) of the voltage Vin that can be processed by the sample-and-hold device in relation to the supply voltage that is applied to it. Indeed, an increase in the level of the voltage Vin that can be processed leads to an improvement of the signal-to-noise ratio at output of the sample-and-hold device and to greater flexibility of use;

consumption: the dynamic performance characteristics are chiefly related to the currents biasing the different arms of the sample-and-hold device. Since the voltage is dictated (by the user), the designer seeks to minimize the current in order to reduce consumption;

linearity: in follower mode, it is important that the output voltage of the sample-and-hold device should faithfully reflect the input voltage Vin, and should do so along the full scale of voltage, namely from the maximum level to the minimum level of the voltage Vin;

the passband: expresses the ability of the sampler to follow a fast signal, and therefore to be used in applications that make heavy demands;

noise: when sampling is done, in addition to the signal Vin, the inherent noise of the sampler is held. If the noise has a spectrum that spreads beyond the spectrum of the signal, then the holding operation brings it to the baseband. This is spectral aliasing. It is therefore indispensable to limit the noise band when it is not indispensable;

harmonic distortion: this may be created by poor linearity as well as by reactive phenomena. In particular, the dynamic current flowing into the sampling capacitor is a cause of dynamic non-linearity and hence of distortion.

More particularly, in held mode, we may refer to:

input/output isolation;

drift: in general, the voltage sampled at the instant t0 is stored by means of a sampling capacitor. The voltage signal held by the sampling capacitor is liable to drift in time because of the presence of leakage currents and of the current consumed by the reading device of this capacitor. This drift should be low, independent of the level of the signal and compatible with the sampling period and a full scale of the signal;

releasing/holding speed: the speed of switching over from one state to another is a major parameter with regard to the use of the circuit in frequency. This requires the sample-and-hold device to receive a signal of maximum width from a clock controlling the change in state, the result of which is that what is actually made is a follow-and-hold device, and not a sample-and-hold device that is ideally controlled by a Dirac pulse.

An important characteristic of sample-and-hold devices is related to the precision with which the input voltage Vin is copied at the time of the holding.

Indeed, the input voltage Vin may be applied to the sampling capacitor through the emitter of a bipolar follower transistor. When the transistor is made non-conductive at the point in time t0, holding the voltage Vin at the terminals of the capacitor, the charge Qst stored in the transistor gets discharged partly by the base and partly by the emitter.

The charge stored by a bipolar transistor that is crossed by a collector current Ic with a transition time Tf characteristic of the technology is given by Qst=Ic.Tf. When the transistor is turned off, Ic becomes zero and the charge removed by the emitter is at the sampling capacitor after the turning off, giving rise to a voltage pedestal Vin.

SUMMARY OF THE INVENTION

The present invention provides improvements in the performance characteristics of the prior art sample-and-hold devices by proposing a sample-and-hold device comprising:

a follower input stage having one input receiving a voltage Vin to be sampled and at least one output, at least one sampling circuit having a switching stage, the switching stage having at least one control input, one signal input connected to the output of the follower input stage, and one output. The switching stage is controlled by its control input by a digital command so that it is placed either in a first state called a "follower" state where its output follows the potential at its signal input or in a second state called an "isolated" state where its output is isolated from it signal input. The output of the switching stage is connected to the base of a first follower transistor whose emitter is connected to a terminal of an output sampling capacitor. The sampling circuit furthermore comprises a second transistor, having its emitter supplied by a current source and having its base connected to a potential copying that of the terminal of the output sampling capacitor, and a third transistor controlled by the digital command so as to be crossed by a current when the switching stage is in the <<isolated state>>, and so as to be off when the switching stage is in the <<follower>> state, the third transistor having its emitter connected to the base of the first transistor and its base connected to the emitter of the second transistor.

To copy the potential of the output sampling capacitor into the base of the second transistor, the sample-and-hold device preferably has an additional sampling capacitor and a fourth follower transistor having its base connected to the output of the switching stage and its emitter connected to a terminal of the additional sampling capacitor for the application, to this terminal, of a voltage copying the potential at the terminal of the output sampling capacitor, the base of the second transistor being connected to the base of the additional sampling capacitor.

In this embodiment, the sample-and-hold device has two capacitors linked to the sampling function: the output sampling capacitor connected solely to an amplifier for the reading of the sampled voltage, and the additional sampling capacitor having a value lower than that of the output sampling capacitor. The voltage of the terminals of the additional sampling capacitor is set up at greater speed than the voltage at the terminals of the output sampling capacitor, thus enabling the reverse potentials for turning the transistors off to be fixed at greater speed. The holding of the sample-and-hold device is thus anticipated, thus making it possible to obtain sharper sampling plateaus as well as better isolation.

In short, the fact of having, in addition to the output sampling capacitor, an additional sampling capacitor at the terminals of which the sampled signal is copied, makes it possible to avoid the injection, into the output sampling capacitor, of the disturbances due to the non-conduction of the transistors, which affect only the additional sampling capacitor.

In one embodiment, according to the invention, of the sample-and-hold device using complementary type technology, and in one and the same sampling circuit, the first and third transistors are of a first type and the second transistor is of the complementary type.

The follower input stage may be made in such a way that it copies the voltage Vin with an offset such that it cancels an offset in an opposite direction due to the electrical structure of the sampling circuit. This has the advantage of obtaining the same DC voltage at the input and the output of the sample-and-hold device.

In another embodiment, two symmetrical sampling devices are used to constitute a symmetrical sample-and-hold device. The follower input stage in this case comprises two outputs copying the input voltage Vin, a first output with a positive voltage offset and a second output with a negative voltage offset with respect to the input of the sample-and-hold device. These two outputs are connected to the terminal of the output sampling capacitor by symmetrical circuits, a first sampling circuit comprising a first switching stage and the first, second, third and fourth transistors and a second sampling circuit constituted identically to the first one but using transistors of a type complementary to those used in the first circuit.

The principle of operation of the sample-and-hold device according to the invention will be understood more clearly if the device is sub-divided into elementary functional blocks which shall hereinafter be found in a full description of this embodiment.

The sample-and-hold device works in follower-hold mode.

In Follower Mode:

FIG. 1a shows a base block comprising a follower transistor Q1, for example of the NPN type, connected by its emitter to a terminal of a sampling capacitor C, the other terminal being connected to a ground M.

Through its base, the follower transistor Q1 receives the voltage Vin to be sampled and to be stored by the sampling capacitor C.

The base-emitter junction is biased at constant current by a current generator I1. The voltage V(c) at the terminals of the sampling capacitor is:

$$V(c)=Vin-Vbe,$$

with Vbe>0

Vbe being the base/emitter voltage of the transistor Q1.

In Hold Mode:

It is therefore necessary to turn off the follower transistor Q1 of FIG. 1a. For this purpose, the current source I1, which is active in follower mode, is then cut off.

The basic diagram of FIG. 1b, comprising two other transistors Q2 and Q3 and two current sources I2 and I3, makes it possible to carry out the holding function of the sampling device.

The follower transistor Q3, which is of the same NPN type as the transistor Q1, is connected by its emitter to the base of the follower transistor Q1 connected by its emitter to the sampling capacitor C. The base-emitter junction of the transistor Q3 is biased by a current generator I3 connected to a negative supply source. The complementary PNP type transistor Q2 is connected by its collector to the ground M and, by its emitter, firstly to the base of the follower transistor Q3 and secondly to a current source I2 connected to a positive supply source, the base of the transistor Q2 being connected to the emitter of the transistor Q1.

In hold mode, the sampling capacitor C is isolated. For this purpose, the follower transistor Q1 must be turned off. This is obtained through the cancellation of its current by making the base-emitter voltage Vbe negative or zero. In the present case, it is made substantially zero through the assembly of FIG. 1b.

In the assembly of FIG. 1b, we then have:

$$Vb=Ve+|Vbe(Q2)|-|Vbe(Q3)|=0 \text{ volts})$$

Vb and Ve being the base and emitter voltages of the transistor Q1.

Vbe(Q2) and Vbe(Q3) being the base-emitter voltages of the transistors Q2 and Q3.

The voltage Vb of the transistor Q1 is zero plus or minus a few millivolts, but this is sufficient to turn the transistor off.

The variation of the base-emitter voltage Vbe(Q1) between the follower mode and the hold mode is equal to Vbe and this variation is independent of the input voltage Vin.

Furthermore, the charge stored Qst in the follower transistor Q1 is:

before holding:

$$Qst=Ic(Q1)*Tf,$$

with

Ic(Q1): dynamic collector current Q1

Tf: transit time in the transistor Q1 after holding: Qst is zero because there is no longer any current $$Ic(Q1)=Ipolar+C.dVin/dt$$

with Ipolar: collector bias current (without variations of the input voltage Vin).

It is always assumed that, to obtain a correct distortion, Ipolar is far greater than C.dVin/dt, which makes it possible to say that Ic(Q1) is substantially constant. Thus, the variation in stored charge is constant, and therefore independent of the input voltage Vin.

When the transistor is turned off, this stored charge gets removed from the transistor Q1 by the base and by the emitter. The distribution of the charges between the base and the emitter depends on the respective impedance values at these points. These impedance values are as follows:

On the emitter of the transistor Q1, since the current source I3 is cut off, all that remains is the sampling capacitor C. The impedance is a capacitive impedance that is fixed.

On the base of the transistor Q1, the impedance is provided by the emitter of the transistor Q3 biased as a follower, the constant impedance being equal to Ut/Ic, with Ut=kT/q and therefore being independent of the level of the signal.

k, being the Boltzmann's constant,

T, being the absolute temperature, and q, the charge of the electron.

Thus, when the transistor Q1 is turned off, the stored charge (independent of the input voltage Vin) gets removed as a function of a fixed ratio of impedances.

Since the pedestal is caused by the fraction of charges that get removed by the emitter of the transistor Q1, it is fixed and independent of the level of the input voltage Vin.

This is a major factor in obtaining low distortion.

Furthermore, through the complementary aspect of a symmetrical configuration of the sample-and-hold device which shall be described hereinafter, comprising two complementary technology follower transistors connected to the sampling capacitor, the charges due to these two transistors being of opposite signs, it is the difference of these charges that is perceived at the capacitor. This has the effect of reducing the absolute value of the pedestal by a ratio of about 5 to 10.

It can also be observed that the holding level is created by only two follower transistors Q1 and Q3. This level is therefore created at extremely high speed once the passage into holding mode is done, unlike in the prior art solutions where this level is created by means of an amplifier. This is necessarily longer and entails a risk of instability (through oscillations).

With the constant current source I1 (class A) to power the transistor Q1, high consumption is needed because it is necessary to have I1>C.(dVin.dt)max.

By adopting the assembly shown in FIG. 1c, this constraint is removed. This assembly has two follower transistors Q4 and Q5 of complementary types, for example of NPN and PNP types respectively, having their emitters connected to the sampling capacitor C, the collector of the transistor Q4 being connected to a positive supply source and the collector of the transistor Q5 being connected to a negative supply source.

A transistor Q6 of the same PNP type as the follower transistor Q5 has its emitter connected firstly to a current source I6 connected to the positive supply source and secondly to the base of the transistor Q4, its collector being connected to the ground M.

A transistor Q7 of the same NPN type as the transistor Q4 has its emitter connected firstly to a current source I7 connected to the negative supply source and secondly to the base of the transistor Q5, its collector being under a positive supply potential. The bases of the transistors Q6 and Q7 are connected to each other.

In this type of symmetrical assembly, the bases of the follower transistors Q4 and Q5 (NPN and PNP) have to be driven respectively by levels (Vin+Vbe) and (Vin−Vbe), these <<Vbe>> values being defined so as to control the current flowing into the NPN and PNP transistors.

The principle consists of the use of a loop called a <<translinear>> loop, namely a loop of base-emitter junctions.

A Reminder of the Principle:

For a base-emitter junction, the voltage-current relationship has the form:

$$Vbe = Ut * In(I/Is)$$

where

I: current in the transistor

Is: reverse saturation current

In: natural logarithm.

In the diagram of FIG. 1c, there is a closed loop of Vbe. It is written that the sum of these values of Vbe in crossing the loop is zero:

$$Vbe(Q6) - Vbe(Q4) - Vbe(Q5) + Vbe(Q7) = 0$$

that is:

$$Ut.In(I6/Isp) - Ut.In(I4)/Isn) - Ut.In(I5/Isp) + UtIin(I7/Isn) = 0$$

with:

Isp: reverse saturation current of the PNP transistors

Isn: reverse saturation current of the NPN transistors

I4, I5, I6, I7 currents in the transistors Q4, Q5, Q6, Q7 whence:

$$I6.I7 = I4.I5$$

Since, at equilibrium, we have I4=I5, we get I4=I5=sqrt (I6.I7) (sqrt=square root). This controls the idle consumption.

For the full diagram of the sampler, a loop formed by eight transistors will be made (four for the schematic diagram of FIG. 1c) but the principle is the same.

In dynamic operation, if Vin varies positively (for example in the case of a voltage step), I4 increases exponentially and I5 decreases exponentially (transiently), the potential on the sampling capacitor C gets readjusted, and there is a tendency towards a new state of equilibrium.

Thus, when Vin varies in steps as for example in the case of a CCD (charge coupled device), it is possible to obtain high efficiency (dynamic current/static current).

For a sampling of a random signal, it is necessary to take a greater idle current with respect to C.dVin/dt to set the harmonic distortion (the charge stored and the Vbe(s) being not constant).

The circuit of FIG. 1c enables an improvement in efficiency in the case of stepped signals (namely for a slope dVin/dt that is negligible at the point in time when the transistor is turned off).

Resistors in the emitters of the follower transistors connected to the sampling capacitor make it possible to:

greatly reduce the idle current, leading to a drop in the consumption of the circuit, reduce the noise on the sampled signal, limit the inductive effect of the emitter (prevent transient local oscillations).

The sample-and-hold device in one embodiment according to the invention referred to here above uses two sampling capacitors that we have designated, one being the output sampling capacitor playing the role of the sampling capacitor of FIGS. 1a, 1b and 1c, and the other being the additional sampling capacitor to which we shall return further below.

Referring to the basic assembly of FIG. 1b, in hold mode, the transistor Q2 is permanently biased but the transistor Q3 is switched over and becomes conductive when the structure passes into hold mode.

This results in a surge of base current of the transistor Q3. This current surge inevitably disturbs also the transistor Q2 and therefore the sampled signal.

To have an output signal that is not disturbed by this effect, the useful signal will be taken at the output sampling capacitor driven by other follower transistors controlled in parallel with the follower transistors controlling the additional sampling capacitor. Thus:

the levels given at the base of the followers driving the output sampling capacitor are created by followers driving the additional sampling capacitor.

The output sampling capacitor does not undergo the disturbances caused by switching. These disturbances are found only in the additional sampling capacitor.

If the signal is slowed down a little on the output sampling capacitor (with the output sampling capacitance being greater than the additional sampling capacitance) and if, possibly, resistors are added to the emitters of the follower transistors, as described further above, then the voltage levels given by the follower transistor Q1 (or the follower transistors Q4 and Q5 in the case of a symmetrical embodiment) on the bases of the transistors driving the additional sampling capacitor are "anticipated".

Thus, the principle of having a constant voltage variation Vbe for the follower at the time of the holding (as described here above with reference to FIG. 1a) is verified all the more efficiently for the additional sampling capacitor. Indeed, for this capacitor, at the time of the holding, the levels providing for the holding are not in the course of being set up but are already set up.

BRIEF DESCRIPTION OF THE DRAWINGS

Other features and advantages of the invention shall appear from the following detailed description made with reference to the appended figures, of which.

MORE DETAILED DESCRIPTION

Figure 2:
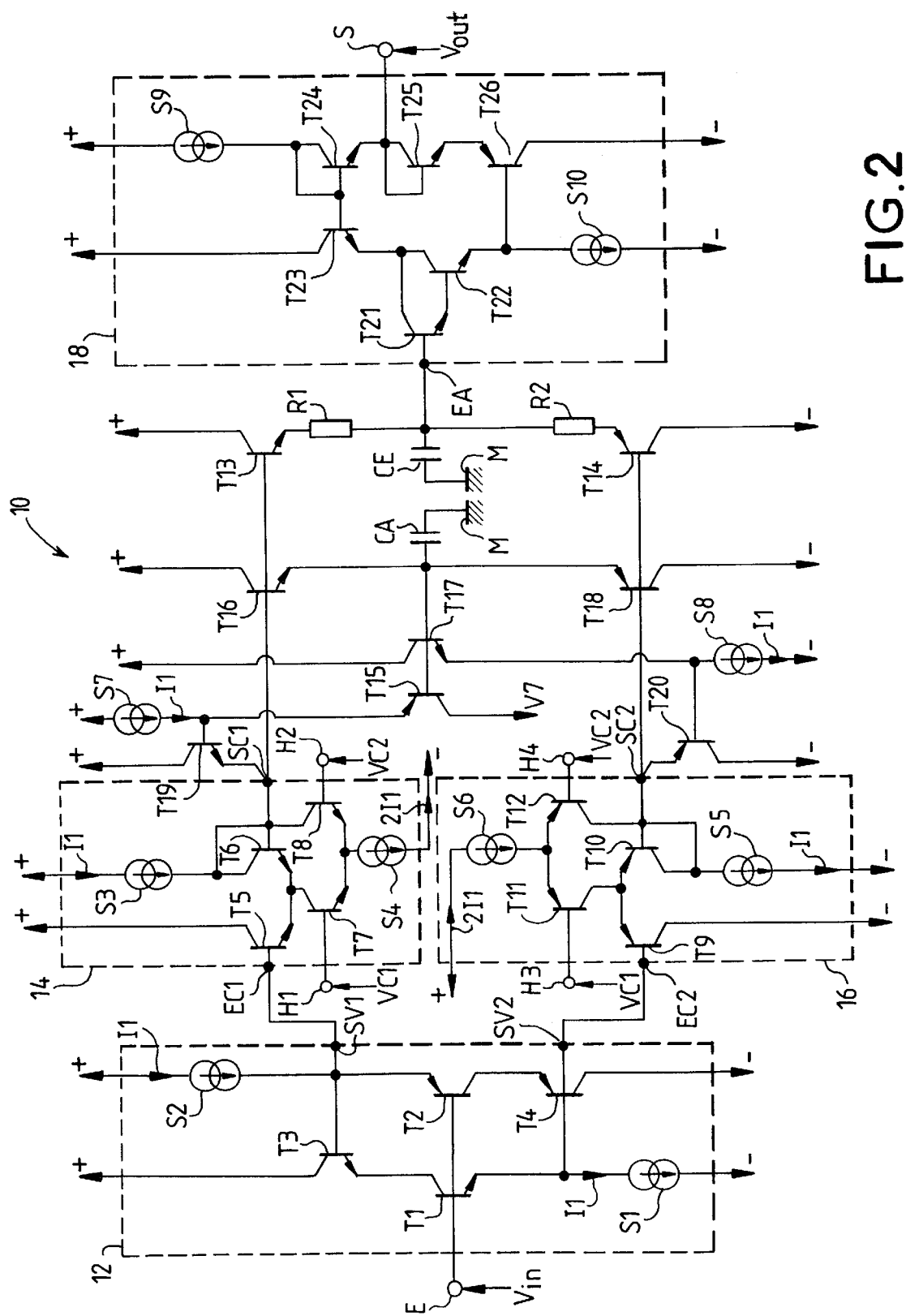
FIG. 2 is an electrical diagram of a symmetrical sample-and-hold device according to the invention.

FIG. 2 shows the electrical diagram of a sample-and-hold device 10 according to the invention comprising an input follower stage 12 having an input E to which an input voltage Vin to be sampled is applied. The input stage 12 gives two follower outputs, a first output SV1 copying the signal Vin with a positive voltage offset with respect to its input E and a second output SV2 copying the signal Vin with a negative voltage with respect to this same input E, the positive offset and the negative offset having substantially identical amplitudes.

The two outputs SV1 and SV2 of the follower input stage are connected to a terminal of an output sampling capacitor CE by a sampling circuit with a two-channel symmetrical constitution which shall hereinafter be called a first sampling circuit and second sampling circuit, the second circuit being constituted identically to the first one but on the basis of transistors of a type complementary to those used in the first circuit.

The sample-and-hold device 10 comprises a positive supply source and a negative supply source not shown in FIG. 2 for the supply of its different circuits.

The input E of the follower input stage is connected firstly to its first output SV1 by the base of an NPN type follower transistor T1, whose emitter is connected to a first input current source S1 powered by the negative supply source, and by the emitter of a follower transistor T2 of a type complementary to the follower transistor T1, i.e. a PNP type, the emitter of the PNP type follower transistor T2 being connected to a second input current source S2 powered by the positive supply source, and its base being connected to the input E of the input follower stage 12. The input E of the follower input stage 12 is furthermore connected to its second output SV2 by the emitter of the NPN type follower transistor T1.

The first and second sources of input current (S1, S2) substantially impose the same bias current I1 in the transistors, causing the appearance of substantially identical bias potentials Vbe between the base and the emitter of each transistor.

A voltage Vin applied to the input E of the follower input stage 12 gives, at its first output SV1, a voltage Vin that is offset positively (or upwards) with respect to the emitter base voltage of the follower transistor T2 and, at its second output SV2, a voltage Vin that is offset negatively (or downwards), with respect to the emitter base voltage of the follower transistor T1 with respect to the input E. These two voltages drive the two symmetrical sampling circuits of the sample-and-hold device 10.

An NPN type transistor T3, whose collector is connected to the positive supply source, is connected by its emitter to the collector of the follower transistor T1 and by its base to the emitter of the follower transistor T2.

The current in the transistor T3 is dictated by the first input current source S1 at a value I1, the transistors T1, T2 and T3 having potentials Vbe that are substantially identical for the current I1.

In this configuration, the voltage between the base and the emitter of the transistor T3 is substantially identical to the voltage between the emitter and the base of the follower transistor T2, namely (Vin+Vbe), leading to a substantially zero voltage Vcb between the collector and the base of the follower transistor T1.

A PNP type transistor T4 having its collector connected to the negative power source is connected by its emitter to the collector of the PNP type follower transistor T2 and by its base to the emitter of the NPN type follower transistor T1.

In the same way, the voltage between the base and the emitter of the follower transistor T1 is substantially identical to the voltage between the emitter and the base of the transistor T4, namely (Vin−Vbe), leading to a substantially zero voltage between the collector and the base of the follower transistor T2.

In certain applications, it is desirable to have a low input capacitor that is independent of the input level.

The follower input stage 12 of the sample-and-hold device 10 according to the invention has the advantage of having an input capacitor Ce with an almost zero value. Indeed, the capacitors connected between the input E of the sample-and-hold device are base-emitter capacitors (Cbe) and base-collector capacitors (Cbc) of the input follower transistors T1 and T2. The voltages at these capacitors are respectively Vbe and Vbc. We have:

Vbe=constant because the transistors are biased by a constant current I1

Vbc=constant because it is equal to the difference between the two voltages Vbe which are themselves constant.

The surges of dynamic currents i in the input of the circuit are:

$$i = C_{be}.dV_{be}/dt + C_{bc}.dV_{bc}/dt.$$

Vbe and Vbc being constant we have i=0
now i=Ce.dVin/dt with Ceq=equivalent capacitance of the input E
therefore Ce=0.

The first output SV1 of the follower input stage 12 drives an input EC1 of the first switching stage 14 of the first sampling circuit, the second output SV2 of the follower input stage 12 driving an input EC2 of a second switching stage 16 of the second sampling stage symmetrical with the first one.

The first switching stage comprises an output SC1 and two control inputs, a first control input H1 and a second control input H2. These two inputs are driven respectively by complementary switching signals VC1 and VC2 given by a digital command (in practice a clock signal). The switching stage 14 furthermore comprises a first NPN type follower transistor T5 and a second follower transistor T6 of the same NPN type whose emitters are connected to one another. The collector of the first follower transistor T5 is connected to the positive power supply source and the collector of the second follower transistor T6 is connected to a current source S3 with a value I1 supplied by the positive power supply source. The base of the first follower transistor T5 is connected to the input EC1 of the first switching stage 14 and the base of the second follower transistor T6 is connected to the output SC1 of the same first switching stage 14.

A first switching transistor T7 and a second switching transistor T8 have their emitter connected to a current source S4 with a value 2.I1 supplied by the negative supply source. The first switching transistor T7 has its collector connected to the emitters of the follower transistors T5 and T6 of the first switching stage, and its base connected to the first control input H1. The second switching transistor T8 has its collector connected to the base and to the collector of the second follower transistor T6 and its base to the second control input H2.

The switching stage has the role of causing the voltage Vin to be followed in "follower" mode and of isolating the input from the output in the hold mode.

When the differential voltage (VC1–VC2) is greater than the switch-over voltage of a differential pair, namely approximately a voltage of 10.kT/q volts, all the current 2.I1 flows into the transistor T7. The differential pair constituted by the follower transistors T5 and T6 is balanced because, into the follower transistor T5, there flows a current equal to 2.I1–I1=I1. Hence the voltage at the output SC1 is equal to the voltage Vin at the input EC1.

When the differential voltage (VC1–VC2) is lower than the switch-over voltage of a differential pair (approximately 10.kT/q volts), all the current 2.I1 gets switched into the transistor T8. The differential pair (follower transistors T5 and T6) no longer has any current and therefore no longer imposes the potential at output SC1. It is therefore necessary to provide for a potential that causes the holding, by a transistor, of the sampling circuit, described further below, which gives the current.

In the second sampling circuit, the second switching stage 16, which is symmetrical with the first switching stage 14, is made identically to the first one but by means of PNP type transistors T9, T10, T11 and T12 that are complementary to those of the first switching stage 14 and two current sources S5 and S6 respectively having a value I1 and 2.I1.

In the first sampling circuit, the switching output SC1 of the first switching stage 14 drives the base of a first NPN type follower transistor T13 having its collector connected to the positive supply source and its emitter connected to the first terminal of the output sampling capacitor CE through a resistor R1, a second terminal of this capacitor being connected to a ground M of the sample-and-hold device 10. A PNP type transistor T15, biased by its emitter by a current source S7 having a value I1, has its base connected to a first terminal of an additional sampling capacitor CA, the first terminal of this capacitor being connected to the emitter of a second NPN type follower transistor T16 having its collector connected to the positive supply source and its base connected to the output SC1 of the first switching stage 14. A second terminal of the additional sampling capacitor CA is connected to a ground M of the sample-and-hold device.

An NPN type transistor T19 (playing the role of a clamp) is connected by its source to the positive supply source, by its emitter to the output SC1 of the first switching stage 14 and by its base to the emitter of the PNP type transistor T15.

In the same way, in the second sampling circuit, the switching output SC2 of the second switching stage 16 drives the base of a first PNP type follower transistor T14 having the collector connected to the negative supply source and its emitter connected to the first terminal of the output sampling capacitor CE through a resistor R2 of the second sampling circuit. This resistor R2 has a value substantially identical to the value of the resistor R1 of the first sampling circuit. The second terminal of the output sampling capacitor CE is connected to a ground M of the sample-and-hold device.

An NPN type transistor T17 is connected by its emitter to a current source S8 with a value I1 powered by the negative power supply source. It is connected by its collector to the positive power supply source and by its base to the same first terminal of the additional sampling capacitor CA, the first terminal of the additional sampling capacitor CA being connected to the emitter of a second PNP type follower transistor T18, its collector being connected to the negative power supply source and its base being connected to the output SC2 of the second switching stage 16.

A PNP type transistor T20 is connected by its collector to the negative power supply source, by its emitter to the output SC2 of the second switching stage 16 and by its base to the emitter of the NPN type transistor T17.

Figure 1A:
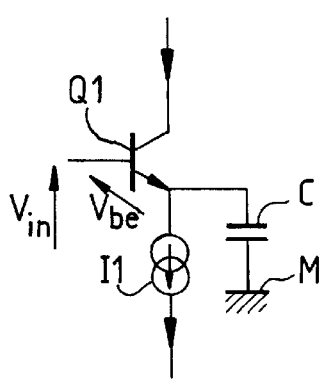
FIGS. 1a, 1b, 1c, already described, are basic diagrams of elements of the sample-and-hold device according to the invention.
Figure 1B:
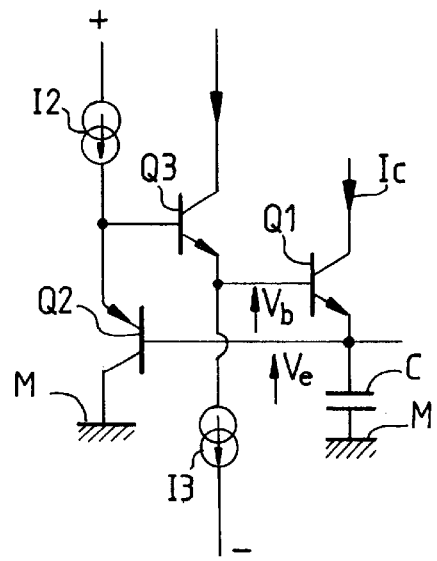
Figure 1C:
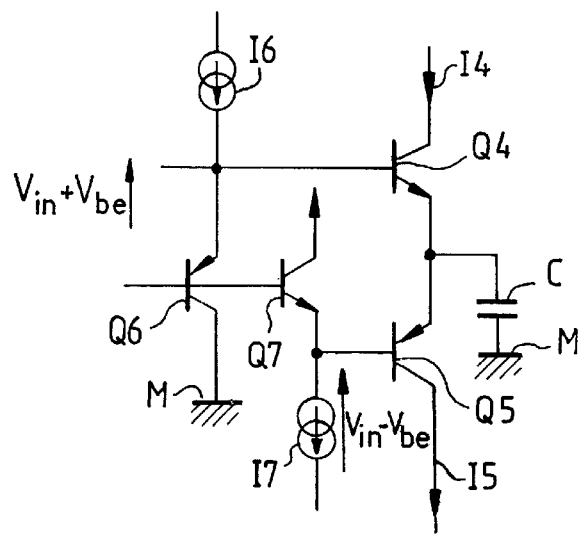

It may be noted that the transistors T16, T15 and T19 or their complementary transistors T18, 17 and T20 in the symmetrical circuit respectively have the same functions as the transistors Q1, Q2 and Q3 of the elementary blocks of FIGS. 1*a* and 1*b* describing the principles of operation.

A detailed description shall be given here below of the sample-and-hold device 10 by means of FIG. 2, and especially of the operation of the first sampling circuit. The second circuit works identically to this first circuit.

1) Sample-and-Hold Device in the "Follower" State:

In this state, the switching voltage VC1 applied by the digital control to the first switching input H1 is in a high state making the switching transistor T7 conductive. The complementary switching voltage VC2, applied by the same digital command to the second selection input H2, is in the low state, making the second switching transistor T8 non-conductive.

The emitters of the two follower transistors T5 and T6 are in a conductive state and the collector current of each transistor is substantially identical to I1. The potential (Vin+Vbe) at the input EC1 of the first switching stage 14 is reproduced at its output SC1. The bases of the follower transistors T13 and T16 are at the potential (Vin+Vbe) and, in the follower state. The voltage at the terminals of the output sampling capacitor CE, after the voltage offset having a value substantially equal to the base-emitter voltage (Vbe) of either one of the follower transistors T13 or T16, then becomes:

$$(Vin+Vbe)-Vbe=Vin$$

With the voltage offset between the input E and the output sampling capacitor getting cancelled (+Vbe and then −Vbe), the continuous level at the input E of the follower stage 12 and of the terminals of the output sampling capacitor CE is substantially the same.

The emitter of the transistor T19 is at the potential (Vin+Vbe), namely the potential at the output SC1 of the first switching stage 14, and its base is at the potential of the emitter of the transistor T15 biased by the current source S7 so as to obtain the voltage Vbe, this potential being (Vin+Vbe). The base-emitter potential of the transistor T19 is (Vin+Vbe)−(Vin+Vbe), i.e. it is substantially equal to zero volts. The transistor T19 is therefore off.

2) The Sample-and-Hold Device is in the "Hold" State:

The sample-and-hold device 10 is switched over at a point in time t0 to the "hold" state by the change in state of the switching voltages VC1 and VC2.

In this "hold" state, the switching voltage VC1 applied by the digital command to the first switching input H1 is in a low state making the first switching transistor T7 non-conductive. The complementary switching voltage VC2 applied by the same digital command to the second switching input H2 is in the high state saturating the second switching transistor T8 crossed by the current I1 of the current source S3.

The emitters of the two follower transistors T5 and T6 are isolated from the current source S4 and the collector current of each transistor is zero. The output SC1 of the first switching stage 14 is then isolated from its input EC1.

The current with a value 2.I1 given by the current source S4 comes firstly from the current I1 in the second switching transistor T8 in the saturated state and secondly from the transistor T19. This transistor T19, in becoming conductive, is crossed by a current with substantially the same value I1.

The current in the transistor T15 given by the current generator S7 remains unchanged, its base voltage being the voltage Vin at the terminals of the additional sampling capacitor CA and the potential of its emitter being (Vin+Vb). Since the base voltage of the transistor T19 is (Vin+Vbe), its emitter is at the potential Vin. Since the bases as well as the emitters of the follower transistors T13 and T16 are at the same potential Vin, these transistors are off, producing the isolation of the additional sampling capacitor CA and the output sampling capacitor CE.

When the sample-and-hold device goes from the follower mode to the hold mode, at the instant t0, a troublesome disturbance is prompted by the current surges on the bases of the transistors T15 and T17 on the additional sampling capacitor CA. There are no such transistors connected to the output sampling capacitor CE.

Since the additional sampling capacitor CA is of a smaller value than the output sampling capacitor CE, and since the emitters of the second sampling transistors T16 and T18 are directly connected to this additional sampling capacitor CA, its action is faster than the action of the output sampling capacitor CE. The output sampling capacitor CE filters the disturbances due to the switching operations of the transistors.

Another advantage of the sample-and-hold device according to the invention appears in its "hold" state. Indeed, in the "hold" state, the output sampling capacitor CE is isolated from the input voltage Vin because there is no longer any current in the follower transistors T5 and T6 of the first switching stage 14.

Figure 3A:
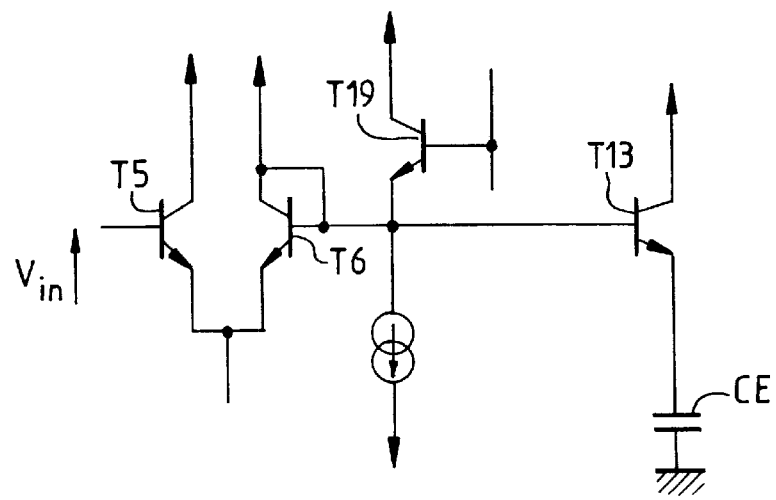
FIG. 3a show the elements of the electrical diagram providing for the hold mode of the sample-and-hold device.
Figure 3B:
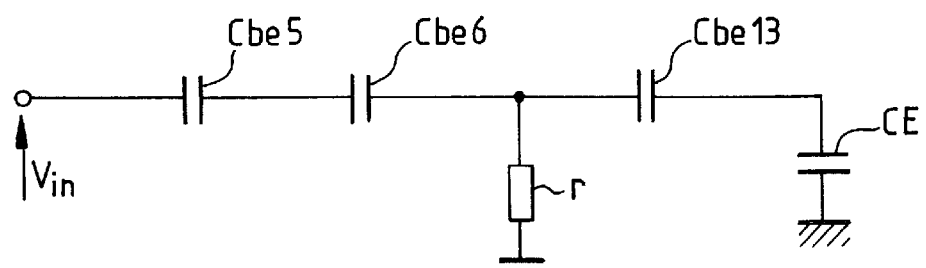
FIG. 3b shows the diagram corresponding to the low-amplitude signals of the elements of FIG. 3a enabling an assessment of the isolation in hold mode.

FIG. 3a shows the elements of the diagram of FIG. 2 that have to provide for isolation in the hold mode between the input voltage Vin and the voltage on the output sampling capacitor CE, and FIG. 3b shows the equivalent diagram corresponding to the low-amplitude signals.

The transmission of the input signal is done by the base-emitter capacitors Cbe5, Cbe6 and Cbe13 series-connected with the follower transistors T5 and T6 of the first switching stage and the first follower transistor T13 of the first sampling circuit. Since the capacitors Cbe5 and Cbe6 of the follower transistors T5 and T6 are moreover short-circuited towards the power supply source by the transistor T19 with a resistance r that is very low in the <<on>> state, this resistance is equal to:

$$r=Ut/Ic(Q19)$$

with Ic(Q19): collector current in the transistor Q19.

The capacitances Cbe5, Cbe6 (reverse junctions) are very low, the resistance r is low and there is a highpass filter whose gain is very low at the frequencies shown in the input signal Vin (the base-emitter capacitors Cbe having very high impedance at these frequencies). This highpass filter is followed by a capacitive attenuator with a high ratio consisting of the capacitors Cbe13 and the output sampling capacitor CE (Cbe13/(Cbe13+CE)) which divides the residual disturbance appearing at the level of the resistance r (transistor T19) by a high factor. The result thereof is an excellent isolation in hold mode.

This is also the case in the second symmetrical sampling circuit (follower transistors T9, T10 and the transistor T20).

Often, in prior art sample-and-hold devices, in hold mode, there is a non-negligible transmission of the input signal Vin towards the sampling capacitor. It is sought to compensate for this transmission by creating transmission of the same amplitude and with an opposite sign. However, this results in limited precision.

The pedestal of the sampled voltage Vin is substantially cancelled by the symmetry of the circuit which furthermore, in the scheme proposed according to the invention, does not depend on the voltage Vin.

The sampling voltage at the terminals of the output sampling capacitor CE is applied to the input EA of a read amplifier 18 with high input impedance in order to prevent any discharging of the output sampling capacitor CE.

The read amplifier 18 comprises a Darlington input stage and an output stage. The Darlington input stage comprises an input transistor T21 and an output transistor T22 which are NPN type transistors. The emitter of the output transistor T22 is connected to a current source S10, powered by the negative power supply source. Its collector is connected to the emitter of an NPN type transistor T23 whose collector is connected to the positive power supply source.

The output stage comprises a first NPN type transistor T24 having its collector connected to a current source S9 powered by the positive power supply source. Its emitter is connected to the collector and to the base of a second transistor T25 of the same type. The emitter of this second transistor is connected to the emitter of a third transistor T6 of a complementary PNP type, the collector of which is connected to the negative power supply source. The base of the transistor T23 of the input stage is connected to the base and to the collector of the first transistor T24 of the output stage. The emitter of the output transistor T22 of the Darlington input stage is connected to the base of the third transistor T26 of the output stage, the output S of the sample-and-hold device 10 being done at the collector of the second transistor T25

The high input impedance of the read amplifier 18 makes it possible to limit the leakage of the output sampling capacitor CE connected to its input EA and thus obtain the benefit of a high time constant for holding the signal stored by the output sampling capacitor CE.

Furthermore, the read amplifier has an input capacitor with a substantially zero value. Indeed, assuming that the voltages Vbe of the different transistors of the read amplifier are substantially identical, we have for the input stage, between the base of the transistor T23 and the emitter of the output transistor T22 of the Darlington stage, a voltage Vd1 equal to three times Vbe plus the collector base voltage of the input transistor T21 of the Darlington stage. In the output stage between the base of the transistor T24 and the base of the transistor T26, there is a voltage Vd2 equal to three times Vbe, Vd1 being equal to Vd2. The collector base voltage Vcb of the input transistor of the Darlington input stage is substantially zero, which as in the case of the follower input stage 12 cancels the effect of the input capacitor of the Darlington input stage.

The cancellation or neutralization of the capacitors of the input transistor T21 of the read amplifier make it possible to prevent it from being turned off during fast transitions of the signal.

The DC potential of the output S of the sample-and-hold device is substantially identical to the DC potential at the input EA of the read amplifier 18. Indeed, the voltage Vin at the input of the read amplifier is shifted by –2.Vbe towards the current generator S10 by the transistors T21 and T22 and by +2.Vbe towards the output S, by the transistors T26 and T25.

The read amplifier described by way of an example may be replaced by other amplifiers using different technologies, for example C-MOS technology stages with very low current consumption.

The use of a bipolar complementary technology and the designing of the electrical diagram in the making of the sample-and-hold device shown in FIG. 2 stacks only two maximum voltages Vbe between the input and the output of the sample-and-hold device. This has the advantage of processing an input signal level (full scale) that is greater for one and the same supply voltage. The embodiment described enables the processing of a dynamic input signal range of 2 volts peak-to-peak for a supply voltage of 5 volts.

The symmetrical structure using NPN type transistors and PNP type transistors naturally sets up A/B class stages. This has the value of entailing low consumption in static mode with the possibility of having a lot of current (positive or negative) during the changes in level at the capacitors. When the final level is reached, the current returns to its nominal value, the output impedance of the stage increases and the noise band is reduced.

Resistors may be series-connected with the emitters of sampling transistors so as to limit the surge voltage factor of the resonant circuit constituted by the sampling capacitor and the inductive part of the emitter impedance due to the cutoff in frequency of the current gain β of the transistors.

Class A/B structures, in addition to enabling the use of the device at a supply voltage of 5 volts, provide for very low consumption without limiting the slope of variation of the output signal.

In general, the sample-and-hold device according to the invention has substantially improved performance characteristics as compared with the performance characteristics of the prior art sample-and-hold devices. In particular, it has the following advantages: low consumption, very high static linearity, wide passband, limited noise, substantially zero input capacitance, limitable distortion, high insulation, low drift and low disturbances in holding mode, fast turning off and turning on, the optimum performances being obtained for sampling on the voltage plateaus.

What is claimed is:

1. A sample-and-hold device comprising a follower input stage having one input receiving a voltage Vin to be sampled and at least one output, at least one sampling circuit having a switching stage, the switching stage having at least one control input, one signal input connected to the output of the follower input stage, and one output, the switching stage being controlled by its control input by a digital command to be placed either in a first state called a "follower" state where its output follows the potential at its signal input or in a second state called an "isolated" state where its output is isolated from it signal input, the output of the switching stage being connected to the base of a first follower transistor whose emitter is connected to a terminal of an output sampling capacitor, the sampling circuit furthermore comprises a second transistor, having its emitter supplied by a current source and having its base connected to a potential copying that of the terminal of the output sampling capacitor, and a third transistor controlled by the digital command so as to be crossed by a current when the switching stage is in the "isolated state ", and so as to be off when the switching stage is in the <<follower>> state, the third transistor having its emitter connected to the base of the first follower transistor and its base connected to the emitter of the second transistor.

2. A sample-and-hold device according to claim 1, wherein the sampling circuit comprises an additional sampling capacitor and a fourth follower transistor having its base connected to the output of the switching stage and its emitter connected to a terminal of the additional sampling capacitor for the application, to this terminal, of a voltage copying the potential at the terminal of the output sampling capacitor, the base of the second transistor being connected to the base of the additional sampling capacitor.

3. A sample-and-hold device according to claim 2, wherein the additional sampling capacitor has a value lower than the output sampling capacitor.

4. A sample-and-hold device according to claim 1 wherein, in at least one sampling circuit, the first and third transistors are of a first type and the second transistor is of a complementary type.

5. A sample-and-hold device according to claim 1, wherein the follower input stage may copies the voltage Vin with a voltage offset.

6. A sample-and-hold device according to claim 1, wherein the follower input stage in this case comprises two outputs copying the voltage Vin, a first output with a positive voltage offset and a second output with a negative voltage offset with respect to the input of the sample-and-hold device, these two outputs being connected to the terminal of the output sampling capacitor by a sampling circuit with a symmetrical two-channel constitution which shall hereinafter be called first, second and third sampling circuits, the second sampling circuit being constituted identically to the first one but using transistors of a type complementary to those used in the first circuit.

7. A sample-and-hold device according to claim 6, wherein the input of the follower input stage is connected firstly to its first output by the base of an NPN type follower transistor T1 whose emitter is connected to a first input current source S1 powered by a negative supply source, and by the emitter of a PNP type follower transistor T2, the emitter of the PNP type follower transistor T2 being connected to a second input current source S2 powered by the positive supply source, and its base being connected to the input of the input follower stage, the input of the input follower stage being furthermore connected to its second output by the emitter of the NPN type follower transistor T1, an NPN type transistor T3, whose collector is connected to the positive supply source, is connected by its emitter to the collector of the NPN type follower transistor T1 and by its base to the emitter of the PNP type follower transistor T2, a PNP type transistor T4 having its collector connected to the negative power source is connected by its emitter to the collector of the PNP type follower transistor T2 and by its base to the emitter of the NPN type follower transistor T1, the first and second sources of input current S1, S2 substantially imposing the same bias current I1 in the transistors, causing the appearance of substantially identical bias potentials Vbe between the base and the emitter of each transistor.

8. A sample-and-hold device according to claim 7, wherein the first output of the follower input stage drives an input of the first switching stage of the first sampling circuit and wherein the second output of the follower input stage drive an input of a second switching stage of the second sampling stage symmetrical with the first one, the first switching stage comprising an output and two control inputs, a first control input and a second control input, these two inputs being driven respectively by complementary switching signals VC1 and VC2, given by a digital command, the switching stage furthermore comprising a first NPN type follower transistor T5 and a second follower transistor T6 of the same NPN type, whose emitters are connected to one another, the collector of the first follower transistor T5 being connected to the positive power supply source and the collector of the second follower transistor T6 being connected to a current source S3 with a value I1 supplied by the positive power supply source, the base of the first follower transistor T5 being connected to the input of the first switching stage and the base of the second follower transistor T6 being connected to the output of the same first switching stage, a first switching transistor T7 and a second switching transistor T8 have their emitters connected to a current source S4 with a value 2.I1 powered by the negative power supply source, the first switching transistor T7 having its collector connected to the emitters of the follower transistors T5 and T6 of the first switching stage, and its base to the first control input, the second switching transistor T8 having its collector connected to the base and to the collector of the second follower transistor T6 and its base to the second control input and wherein, in the second sampling circuit, the second switching stage, which is symmetrical with the first switching stage, is made identically to the first one but by means of PNP type transistors T9, T10, T11 and T12 that are complementary to those of the first switching stage and of two current sources S5 and S6 respectively having a value I1 and 2.I1.

9. A sample-and-hold device according to one of the claims 6 to 8 wherein, in the first sampling circuit, the switching output of the first switching stage drives the base of a first NPN type follower transistor T13 having its collector connected to the positive supply source and its emitter connected to the first terminal of the output sampling capacitor through a resistor R1, a second terminal of the output sampling capacitor being connected to the ground M of the sample-and-hold device, a PNP type transistor T15, biased by its emitter by a current source S7 having a value I1, has its base connected to a first terminal of an additional sampling capacitor, the first terminal of the additional sampling capacitor being connected to the emitter of a second NPN type follower transistor T16 having its collector connected to the positive supply source and its base connected to the output of the first switching stage, a second terminal of the additional sampling capacitor being connected to the ground M of the sample-and-hold device, an NPN type transistor T19 being connected by its collector to the positive supply source, by its emitter to the output of the first switching stage and by its base to the emitter of the PNP type transistor T15, and wherein, in the second sampling circuit, the switching output of a second switching stage drives the base of a first PNP type follower transistor T14 having the collector connected to the negative supply source and its emitter connected to the first terminal of the output sampling capacitor through a resistor R2 of the second sampling circuit, having a value substantially identical to the value of the resistor R1 of the first sampling circuit, and wherein, symmetrically, an NPN type transistor T17 having its emitter connected to a current source S8 with a value I1 powered by the negative power supply source, its collector being connected to the positive power supply source and its base being connected to the same first terminal of the additional sampling capacitor, the first terminal of the additional sampling capacitor being connected to the emitter of a second NPN type follower transistor T18, its collector being connected to the negative power supply source and its base being connected to the output of the second switching stage, and in that, symmetrically, a PNP type transistor T20 is connected by its collector to the negative power supply source, by its emitter to the output of the second switching stage and by its base to the emitter of the NPN type transistor T17.

10. A sample-and-hold device according to one of the claims 1 to 9, comprising a read amplifier having an input and an output, the sampling voltage at the terminals of the output sampling capacitor being applied to the input of the read amplifier.

11. A sample-and-hold device according claim 10, wherein the read amplifier comprises a Darlington input stage and an output stage, the Darlington stage having an input transistor T21 and an output transistor T22 that are NPN type transistors, the emitter of the output transistor T22 being connected to a current source S10, powered by the negative power supply source and its collector being connected to the emitter of an NPN type transistor T23 of the input stage, whose collector is connected to the positive power supply source, the output stage comprising a first NPN type transistor T24 having its collector connected to a current source S9 powered by the positive power supply source, its emitter connected to the collector and to the base of a second transistor T25 of the same type, the emitter of this second transistor being connected to the emitter of a third transistor T6 of a complementary PNP type, the collector of which is connected to the negative power supply source, the base of the transistor T23 of the input stage being connected to the base and to the collector of the first transistor T24 of the output stage, the emitter of the output transistor T22 of the Darlington input stage being connected to the base of the third transistor T26 of the output stage, the output of the sample-and-hold device being set up at the collector of the second transistor T25.

* * * * *